US006864311B2

(12) United States Patent
Breunig et al.

(10) Patent No.: US 6,864,311 B2
(45) Date of Patent: Mar. 8, 2005

(54) COMPOSITION (E. G. INK OR VARNISH) WHICH CAN UNDERGO CATIONIC AND/OR RADICAL POLYMERIZATION AND/OR CROSSLINKING BY IRRADIATION, BASED ON AN ORGANIC MATRIX, A SILICONE DILUENT AND A PHOTOINITIATOR

(75) Inventors: Stefan Breunig, Vienne (FR); Jean-Marc Frances, Meyzieu (FR)

(73) Assignee: Rhodia Chimie, Boulogne Billancourt (FR)

( * ) Notice: Subject to any disclaimer, the term of this patent is extended or adjusted under 35 U.S.C. 154(b) by 2 days.

(21) Appl. No.: 10/404,694

(22) Filed: Apr. 1, 2003

(65) Prior Publication Data

US 2003/0225199 A1 Dec. 4, 2003

Related U.S. Application Data

(63) Continuation of application No. 09/922,614, filed on Aug. 6, 2001, now abandoned, which is a continuation of application No. 09/381,888, filed as application No. PCT/FR98/00566 on Mar. 20, 1998, now abandoned.

(30) Foreign Application Priority Data

Mar. 25, 1997 (FR) ............................................. 97 03916

(51) Int. Cl.$^7$ ............................................. C08L 83/00
(52) U.S. Cl. ...................... 524/588; 502/185; 528/15; 528/19; 528/31; 528/32; 528/41; 528/27; 528/421; 528/418; 556/451; 549/512; 106/31.13; 522/31
(58) Field of Search .......................... 502/185; 528/15, 528/19, 31, 32, 41, 27, 421, 418; 556/451; 549/512; 106/31.13; 524/588; 522/31

(56) References Cited

U.S. PATENT DOCUMENTS

| 3,628,963 A | * | 12/1971 | Akamatsu et al. | ........ 430/285.1 |
| 4,024,297 A | | 5/1977 | Gruber | ........................ 427/54 |
| 4,133,939 A | | 1/1979 | Bokerman | .................. 428/447 |
| 4,331,704 A | | 5/1982 | Watson, Jr. | ................. 427/54.1 |
| 4,547,431 A | | 10/1985 | Eckberg | ...................... 428/413 |
| 4,617,238 A | | 10/1986 | Crivello | ...................... 428/452 |
| 4,663,185 A | * | 5/1987 | Eckberg | ...................... 427/503 |
| 5,217,805 A | | 6/1993 | Kessel | .......................... 522/170 |
| 5,229,251 A | | 7/1993 | Babich | ......................... 430/280 |
| 5,415,816 A | | 5/1995 | Buazza | ....................... 264/1.38 |
| 5,460,922 A | * | 10/1995 | Swirbel et al. | ............. 430/315 |
| 5,527,935 A | | 6/1996 | Stepp | .......................... 556/445 |
| 5,576,356 A | | 11/1996 | Leir | ............................. 522/31 |
| 5,866,666 A | | 2/1999 | Herzig | ......................... 528/28 |

FOREIGN PATENT DOCUMENTS

| EP | 0 389 927 | 10/1990 | ........... C08G/59/68 |
| EP | 0 739 945 | 10/1996 | ........... C08L/63/00 |
| WO | WO 93/0828 | 4/1993 | ......... C09D/183/06 |

OTHER PUBLICATIONS

Textbook of Polymer Science (3$^{rd}$ Edition) Fred W. Billmeyer, Jr.
International Search Report.

* cited by examiner

Primary Examiner—Kuo-Liang Peng

(57) ABSTRACT

The invention aims at improving such compositions by proposing a non-toxic diluent harmless to reactivity and by making these compositions translucent, free from metallic impurities and capable of constituting light-polymerisable varnish with good properties of ductility for leveling and surface coating. This aim is achieved by the invention which proposes a composition comprising an organic polymerisable matrix A, containing cyclo-aliphatic epoxide resins or not, acrylates, alkenyl-ethers or polyols, a silicon diluent B with viscosity less than 100 MPa's, a radical and/or cationic (onium salt) photoinitiator C, optionally a light-sensitising material D, a pigment E and another additive F; provided that when A is a cyclo-aliphatic epoxide resin, B has a metal concentration not more than 100 ppm. The invention also concerns the use of the silicon diluent B for preparing a composition crosslinkable by cationic and/or radical process, under UV radiation, in the presence of a photoinitiator (ink or varnish).

10 Claims, 1 Drawing Sheet

COMPOSITION (E. G. INK OR VARNISH) WHICH CAN UNDERGO CATIONIC AND/OR RADICAL POLYMERIZATION AND/OR CROSSLINKING BY IRRADIATION, BASED ON AN ORGANIC MATRIX, A SILICONE DILUENT AND A PHOTOINITIATOR

CROSS REFERENCES TO RELATED APPLICATIONS.

This application is a continuation application of application Ser. No. 09/922,614, now abandoned, filed on Aug. 06, 2001 which is a continuation application of application Ser. No. 09/381,888, filed on Feb. 15, 2000, now abandoned which is a 371 of PCT/FR98/00566 filed Mar. 20, 1998.

BACKGROUND OF THE INVENTION (1) Field of the Invention

The field of the invention is that of photopolymer systems which can be crosslinked and/or polymerized by irradiation, and in particular by UV irradiation or by a beam of electrons, and which can be used in particular to form coatings, such as inks or varnishes.

These compositions are of the type comprising an organic matrix whose constituents bear functions that are reactive in polymerization/crosslinking, as well as a photoinitiator which, after absorbing energy, for example UV energy, releases a strong acid: $H^+$ (cationic route) or a free radical (radical route). Cationic photoinitiators thus allow the initiation and propagation of cationic chain polymerizations, whereas radical photoinitiators (PIs) allow the triggering of chain polymerizations by formation of free radicals.

In certain applications of coatings or inks (or even of dark varnishes), additives are used, such as pigments, which are capable of appreciably increasing the viscosity of the compositions, to such a point that they can no longer be spread and manipulated. It goes without saying that these are unacceptable drawbacks for the applications under consideration. To overcome this, diluents have been incorporated into these compositions in order to reduce their viscosity.

In the case of clear varnishes, diluents or co-reagents are sought which are capable of improving the flexibility of the coatings, without reducing the reactivity of the systems.

The diluents most commonly used to date in photopolymerizable ink or varnish compositions are products of vinyl ether type (in particular divinyl ether) or of limonene type (in particular epoxidized limonene).

Although these products satisfy a certain number of specifications required in the technical specifications for the diluent, i.e., in particular, the miscibility with the organic matrix or the organic resin, the transparency or the inexpensive nature, these known diluents fail as regards considerations of environmental protection, safety and industrial constraints.

The reason for this is that these products are particularly volatile (relatively low flash point, of less than or equal to 110° C.), toxic, or even hazardous, since they are explosive and flammable. These known diluents, of the vinyl ether or epoxidized limonene type, are moreover irritants and sensitizing agents.

In addition, they do not make it possible to achieve sufficiently high rates of polymerization, which would allow the concentrations of photoinitiator to be reduced, thereby greatly easing the strain on the cost of the compositions.

(2) Description of Related Prior Art Including Information Disclosed Under 37 CFR 1.97 and 1.98

Photopolymerizable coating compositions comprising organic cycloaliphatic polyepoxides combined with an $\alpha,\omega$-epoxycycloaliphatic functionalized siloxane, present in an amount which allows acceleration of the crosslinking, are moreover known from patent application EP 0 389 927. The photoinitiators used are onium salts.

This composition is presented as having an improved speed of crosslinking. The $\alpha,\omega$-cycloaliphatic epoxyfunctional siloxane is thus used as a polymerization accelerator for polymerizable coating systems, based on UV-polymerizable cycloaliphatic polyepoxides. That patent application discloses, in particular, compositions based on:
- 3,4-epoxycyclohexylmethyl 3,4-epoxycyclohexylcarboxylate, which constitutes the polymerizable matrix,
- an agent for reducing the energy required for the photopolymerization, said agent consisting of $\alpha,\omega$-3,4-epoxycyclohexyl-1-ethyldimethyldisiloxane, and
- a photoinitiator consisting of (4-octyloxyphenyl) phenyliodonium hexafluoroantimonate as a solution in 2-ethyl-1,3-hexanediol.

The drawback of compositions of this type is their turbid, coloured, and thus non-transparent appearance. They moreover contain a significant amount of metal, which is not foreign to the problem of absence of translucency and transparency and, what is more, is liable to disrupt the polymerization mechanism.

$\alpha,\omega$-Epoxy dimethyldisiloxanes are moreover known as monomers that can undergo cationic polymerization under UV, in the presence of photoinitiators of the onium salt type. The article by Crivello published in *J. Polym. Sci.: Part A: Polym. Chem.*, 1994, Vol. 32, 683–697 deals with this subject and shows that the cycloaliphatic epoxide functions are more reactive in cationic polymerization under UV than conventional epoxide functions.

The article by R. P. Eckberg & K. D. Riding *Polym. Mater. Sci. Eng.*, 1989, 60, 222-7 discloses the cationic polymerization/crosslinking, under UV activation and in the presence of a photoinitiator of the onium salt type, of mixtures of $\alpha,\omega$-epoxy dimethyldisiloxanes ($M^E M^E$) with cycloaliphatic epoxides of formula:

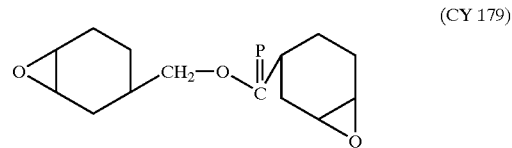

(CY 179)

According to that document, the $M^E M^E$ has no pronounced effect on the efficacy of the rate of polymerization/crosslinking for $M^E M^E$ concentrations of less than 45% by weight relative to the $M^E M^E$/CY 179 mixture (FIG. 1). Such concentrations are not of a nature to promote the use of $M^E M^E$, since this additive cannot be predominant in the formulation, since it would otherwise make the polymer/reticulate unsuitable for the applications for which it is intended (e.g. antiadhesive paper coating, varnish, inks).

What is more, the crosslinked products obtained from such $M^E M^E$/CY 179 mixtures suffer from the major drawback of being brittle, which is unacceptable in a good many applications.

Finally, these compositions are also affected by turbidity and metal contamination defects, in much the same way as the compositions according to EP 0 389 927.

The unavoidable conclusion is that the prior art does not suitably satisfy the specifications expected of compositions that can be polymerized and/or crosslinked by irradiation, such as those intended for ink and varnish applications. In particular, the prior art does not disclose, or even suggest, means (diluents) for controlling the viscosity of photopolymerizable pigmented inks which are not toxic and which do not have a harmful effect on the reactivity of the composition.

Similarly, in the field of photopolymerizable clear varnishes, no inoffensive additives exist which are capable of improving the flexibility of the coatings, the spreading or the surface state, without at the same time impeding the photopolymerization and/or crosslinking.

It should also be noted that the prior art does not provide a satisfactory solution as regards, on the one hand, the problems of transparency and translucency, and, on the other hand, the presence of metal impurities, in the photopolymerizable compositions under consideration.

Finally, the prior art presents an even greater dearth in the case of polymerization reactive functions which are not epoxy but, for example, either alkenyl ether (e.g. vinyl ether)—via the cationic route—, or acrylate or hydroxyl—via the radical route.

In this state of knowledge, one of the essential aims of the present invention is to overcome the existing deficiencies by providing compositions that can undergo cationic and/or radical photopolymerization, which satisfy the expectations of their fields of application, in particular as regards inks and varnishes.

With this set objective, the Applicant Company has, to its credit, on the one hand, isolated and selected a silicone compound of the functionalized di- or oligosiloxane type, and, on the other hand, used this compound in a novel manner as a diluent in photopolymerizable compositions, for example in inks or varnishes.

BRIEF SUMMARY OF THE INVENTION

Accordingly, the invention, which is the subject of the present application, is a composition which can undergo cationic and/or radical polymerization and/or crosslinking by irradiation, preferably actinic irradiation and/or with (a) beam(s) of electrons, characterized in that it comprises:

A. at least one polymerizable organic matrix and/or at least one partially polymerized organic matrix, comprising (co)monomers and/or (co)oligomers and/or (co)polymers chosen from those containing epoxy ($\alpha_1$) and/or acrylate ($\alpha_2$) and/or alkenyl ether ($\alpha_3$) and/or hydroxyl ($\alpha_4$) reactive functions (frA), with the exclusion of cycloaliphatic epoxides ($\alpha_{11}$);

B. at least one silicone diluent with a viscosity $\eta r$ at 25° C. of less than or equal to 200 mPa·s, preferably less than or equal to 150 mPa·s, and even more preferably less than or equal to 100 mPa·s, and comprising: at least one unit of formula (I):

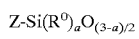

in which:
a=0, 1 or 2,
$R^0$ is independently an alkyl, cycloalkyl, aryl, vinyl, hydrogeno or alkoxy radical, preferably a $C_1$–$C_6$ lower alkyl,
Z is an organic substituent comprising at least one epoxy and/or acrylate and/or alkenyl ether and/or hydroxyl reactive function frB, with the condition that at least a portion of the functions frB is of the same nature as at least a portion of the functions frA of the matrix A,
and at least two silicon atoms, C. an effective amount of at least one cationic and/or radical photoinitiator,
D. optionally, at least one photosensitizer,
E. optionally, at least one pigment,
F. optionally, at least one other additive.

DETAILED DESCRIPTION OF THE INVENTION

Apart from the case in which the matrix A comprises compounds bearing reactive functions frA of the cycloaliphatic expoxide type, the choice of the silicone B as diluent for the composition is of a nature to solve the problems of viscosity in dark inks and varnishes, and of flexibility, spreading or sliding in clear varnishes that can undergo cationic and/or radical photopolymerization, under UV.

In addition, the diluent B, used in accordance with the invention, has the advantage of being cost-effecitve, non-toxic, non-irritant and non-sensitizing and thus easy to handle. Furthermore, this diluent B does not disrupt either the transparency or the reactivity of the photopolymerizable composition.

It is moreover surprising to note that the concept, according to the invention, of a functionalized silicone diluent containing a di- or oligosiloxane skeleton is applicable not only when the reactive functions frA of the matrix are of epoxy type (cationic route), but also when frA=alkenyl ether (cationic), frA=acrylate or frA=epoxy.

It should be noted that, for frA=OH, the condition according to which the compound(s) of the said matrix comprise(s) at least 2 OH per molecule must be respected. In this case, these compounds will be polyols.

According to one variant of the invention, in which the cycloaliphatic epoxides are not excluded from the list of possible constituents for the matrix A, it is preferred to use a diluent B which has a metal concentration of less than or equal to 100 ppm, preferably less than or equal to 50 ppm and even more preferably less than or equal to 20 ppm.

This specific feature of the purity of the diluent B gives the composition transparency and translucency properties that are particularly valuable for applications in varnishes, or even in inks in certain cases.

Accordingly, even more preferably, the diluent B is selected such that it has a coloration of less than or equal to 200 Hazen, preferably less than or equal to 150 Hazen and even more preferably less than or equal to 100 Hazen, this diluent B being soluble to a proportion of at least 5%, preferably at least 10% and even more preferably 20% by weight in the matrix A, this percentage of solubility being expressed relative to the mass of the matrix A rather than of the mixture A+B.

According to another advantageous feature of the invention, the silicone diluent B is obtained by hydrosilylation of a synthon bearing an ethylenically unsaturated function and a function frB using a hydrogenated silicone oil, in the presence of a heterogeneous catalytic composition comprising at least one metal chosen from the group consisting of Co, Rh, Ru, Pt and Ni, deposited on an inert support.

In this method for obtaining the diluent B by hydrosilylation, the silicone oil is reacted with different or identical synthons containing a hydrocarbon-based ring which includes an oxygen atom. This reaction is carried out in the presence of a heterogeneous catalytic composition comprising a metal chosen from the group consisting of cobalt, rhodium, ruthenium, platinum, palladium and nickel deposited on an inert support. Preferably, the metal in the catalytic composition is platinum.

The amount of metal contained in the heterogeneous catalytic composition is between 0.005% and 5% relative to the weight of the inert support. This amount of metal is also between 1 and 1000 ppm relative to the weight of the silicone oil.

By convention, the expression "heterogeneous catalytic composition" means a catalytic composition which may be solid or liquid and which is not dissolved in the reaction medium, i.e. the reaction medium comprises at least two phases, one of which is formed by the catalytic composition.

The metal is deposited on a variety of inert supports such as carbon black, charcoal, alumina, treated or untreated silica, barium sulphate or crosslinked silicones. Advantageously, the particle size of the catalytic supports is greater than 10 μm in order to have good filterability without the need for filtration adjuvants. Thus, this particle size is such that the filtration time can be reduced considerably.

The synthons contain at least one hydrocarbon-based ring which includes an oxygen atom, and have the formula:

• (1)

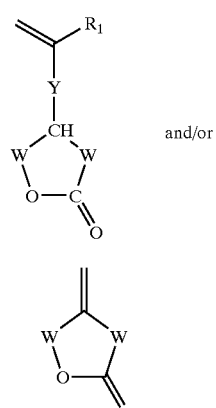

in which:

the symbols W are identical or different and correspond to a divalent hydrocarbon-based radical chosen from linear or branched alkylene radicals containing from 1 to 12 carbon atoms, it being possible for one of the symbols W to be a free valency;

the symbol Y corresponds to a free valency or a divalent radical chosen from linear or branched alkylene radicals containing from 1 to 12 carbon atoms, and which can contain a hetero atom, preferably an oxygen atom;

the symbol $R_1$ corresponds to a hydrogen atom or a monovalent hydrocarbon-based radical chosen from linear or branched alkyl radicals containing from 1 to 12 carbon atoms and, preferably, corresponds to a hydrogen atom or a methyl radical;

• (2)

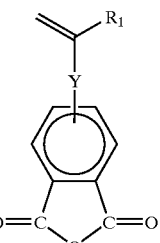

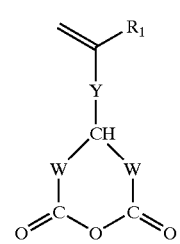

in which:

the symbols W are identical or different and correspond to a divalent hydrocarbon-based radical chosen from linear or branched alkylene radicals containing from 1 to 12 carbon atoms, it being possible for one of the symbols W to be a free valency;

the symbol Y corresponds to a free valency or a divalent radical chosen from linear or branched alkylene radicals containing from 1 to 12 carbon atoms, and which can contain a hetero atom, preferably an oxygen atom;

the symbol $R_1$ corresponds to a hydrogen atom or a monovalent hydrocarbon-based radical chosen from linear or branched alkyl radicals containing from 1 to 12 carbon atoms and, preferably, corresponds to a hydrogen atom or a methyl radical;

• (3)

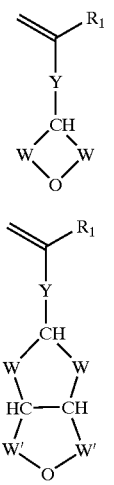

in which:

the symbols W are identical or different and correspond to a divalent hydrocarbon-based radical chosen from linear or branched alkylene radicals containing from 1 to 12 carbon atoms and possibly containing at least one hydroxyl function; it being possible for one of the symbols W to be a free valency for (V) and the two symbols W can simultaneously be a free valency for (VI);

the symbols W' are identical or different and correspond to a divalent hydrocarbon-based radical chosen from linear or branched alkylene radicals containing from 1 to 12 carbon atoms, it being possible for at least one of the symbols W' to be a free valency;

the symbol Y corresponds to a free valency or a divalent radical chosen from linear or branched alkylene radicals containing from 1 to 12 carbon atoms and possibly containing a hetero atom, preferably an oxygen atom;

the symbol $R_1$ corresponds to a hydrogen atom or a monovalent hydrocarbon-based radical chosen from linear or branched alkyl radicals containing from 1 to 12 carbon atoms and, preferably, corresponds to a hydrogen atom or a methyl radical;

• and (4)

(VII)

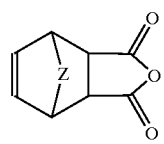

in which:

the symbols W are identical or different and correspond to a free valency and a divalent hydrocarbon-based radical chosen from linear or branched alkylene radicals containing one or two carbon atoms;

the symbol Z corresponds to a divalent radical chosen from a carbon atom and a hetero atom.

Preferably, the hydrocarbon-based ring in which the hydrogen atom is included comprises not more than 8 atoms in said ring. Furthermore, the best results in accordance with the hydrosilylation process of the invention are obtained with synthons containing only one hydrocarbon-based ring in which an oxygen atom is included. In particular, the synthons used which give good results (see the examples below) have the formula:

(VIII)

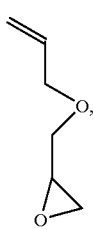

(IX)

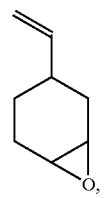

(X)

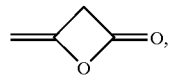

(XI)

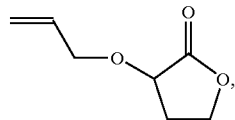

(XII)

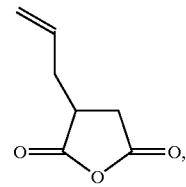

(XIII)

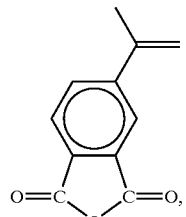

(XIV)

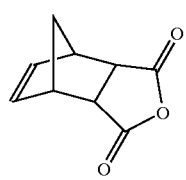

(XV)

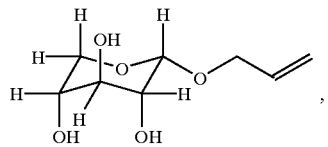

(XVI)

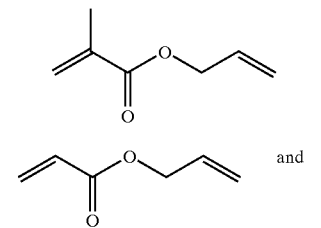

(XVII)

and

In general, the synthons which react with the silicone oil are identical synthons. The molar ratio of the silicone oil/synthons is between 0.01 and 100, preferably between 0.1 and 10.

Different types of heterogeneous catalytic compositions can be used.

Non-limiting examples of such compositions which can be used are platinum on carbon black or on charcoal, such as the catalytic composition containing 2.5% by weight of platinum deposited on the support CECA 2S, developed by the company CECA, the catalytic composition SCAT 20 (1% Pt) from the company Engelhard or the catalytic composition 88 231 (1% Pt) from the company Heraeus. In this case, the platinum can be deposited on this type of support by deposition of chloroplatinic acid followed by neutralization and reduction. Similarly, the use of platinum on alumina preferably of α type, such as the catalytic composition CAL 101 (0.3% Pt, SCS9 support consisting of α-alumina) sold by the company Procatalyse or the catalytic composition 88 823 from the company Heraeus (0.5% Pt on α-alumina) gives good results.

This process for obtaining the diluent B used in the composition according to the invention can be carried out according to a number of variants. It is thus possible in particular to make use of a first embodiment in which all of the reagents and the catalytic composition are mixed together in the reaction medium ("batch" type). A second embodiment of this process can be a continuous mode with a fixed bed of heterogeneous catalytic composition over which pass the silicone oil to be functionalized and the synthon. This type of embodiment is advantageous when the grain size of the inert support of the catalytic composition is greater than 100 μm.

An exemple of the first embodiment is given below:

(a) an amount of 5 to 5000 ppm, preferably from 10 to 1000 ppm, of heterogeneous catalytic composition relative to the total mass of the reagents is introduced into the reaction medium under inert gas;

(b) the synthon is introduced into the reaction medium;

(c) the said medium is heated to a temperature of between 25° C. and 200° C., preferably between 50° C. and 160° C.;

(d) the silicone oil is then introduced over a period of between 0 and 24 hours, preferably between 2.5 and 5 hours; the synthon/silicone molar ratio being between 1 and 1.10.

(e) the reaction mass is then filtered in order to separate the heterogeneous catalytic composition and the functionalized silicone oil; and (f) the functionalized silicone oil is finally freed of volatile material.

This process can be carried out in bulk, which means that the reaction between the silicone oil and the synthon is carried out in the absence of solvent. However, many solvents, such as toluene, xylene, octamethyltetrasiloxane, cyclohexane or hexane, can be used.

Moreover, the molar amount of synthon added during step (b) is less than that which is used for a standard process of the prior art. Advantageously, the synthon/silicone oil molar ratio is between 1 and 1.05, without having a harmful effect on the quality of the functionalized oils obtained or on the reaction yield.

The filtration step (e) makes it possible, where necessary, to remove all trace of turbidity from the functionalized silicone oil obtained. Moreover, the heterogeneous catalytic composition can be recovered and then reused, without regeneration being needed, with or without washing, and without any substantial decrease in its performance levels being detected.

As regards the preferred structural properties of the diluent B, it should be noted that this diluent corresponds to at least one of the following general formulae:

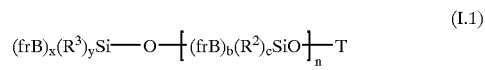
(I.1)

in which:

T=$R^3$ or $Si(R^3)_u(frB)_v$,
x+y=3; x=1 to 3; y=0 to 2;
b+c=2; b, c=0, 1 or 2;
u+v=3; u, v=0 to 3;

$0 \leq n \leq 15$, $R^2$ and $R^3$ are identical or different and correspond to the same definition as that given above for $R^0$ in formula (I), $C_1$–$C_6$ lower alkyl and/or alkoxy radicals being particularly preferred as radicals $R_2$ and $R_3$, respectively, frB being as defined above in the passage which concerns the substituent Z of formula (I),

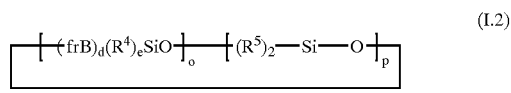
(I.2)

in which:

d+e=2; d=1 or 2; e=0, 1 or 2;
o+p≤15, preferably ≤10; o≥1;

$R^4$ and $R^5$ are, respectively and together, identical to or different from each other and correspond to the same definition as that of $R^2$ given above.

The reactive functions frB of the diluent B which are more particularly used in the context of the invention are of epoxide, vinyl ether or acrylate nature. More specifically, these functions frB are chosen, for example, from the following radicals:

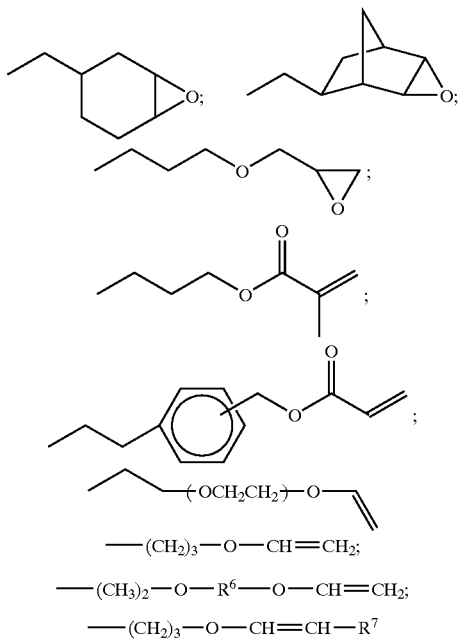

—$(CH_2)_3$—O—CH=$CH_2$;
—$(CH_3)_2$—O—$R^6$—O—CH=$CH_2$;
—$(CH_2)_3$—O—CH=CH—$R^7$ with $R^6$:
optionally substituted linear or branched $C_1$–$C_{12}$ alkylene,
or arylene, preferably phenylene, optionally substituted, preferably with one to three $C_1$–$C_6$ alkyl groups, with $R^7$=linear or branched $C_1$–$C_6$ alkyl.

As examples of diluent B, consisting of at least one functionalized di-, oligo- or polysiloxane frB, mention may be made of those of the following formulae:

a) 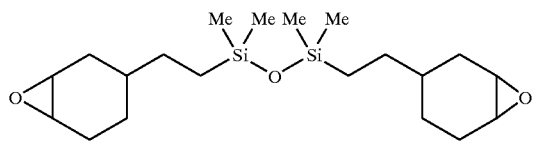

b) 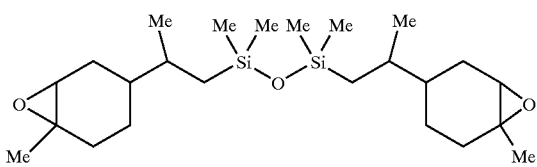

c) 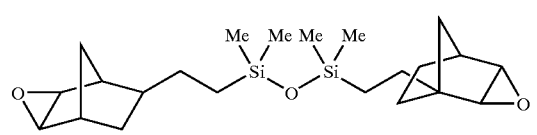

d) 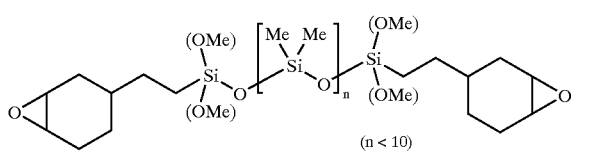

e) 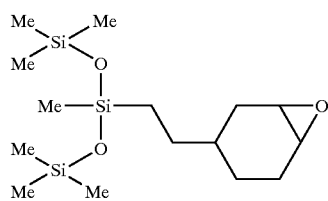

f) 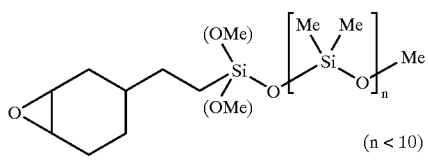

g) 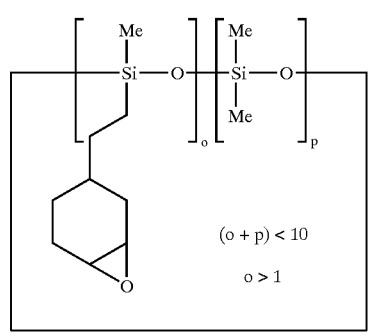

h) 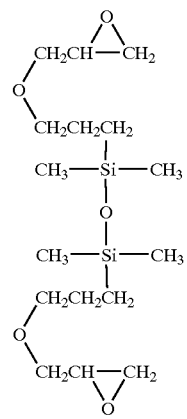

i) 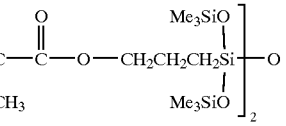

j) 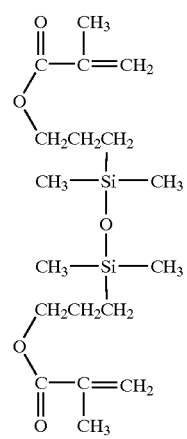

k) 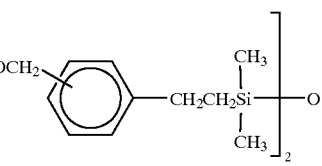

The silicone diluent B according to the invention is less important in quantitative terms than the matrix A, which constitutes the predominant component of the composition. As regards this composition, these constituents belong to at least one of the following species:

$\alpha_{1.1}$) cycloaliphatic epoxides, taken alone or as a mixture with each other:
    epoxides of the type 3,4-epoxycyclohexylmethyl 3',4'-epoxycyclohexanecarboxylate:

or bis(3,4-epoxycyclohexyl) adipate, being particularly preferred;

$\alpha_{1.2)}$ non-cycloaliphatic epoxides, taken alone or as a mixture with each other:
- epoxides of the type resulting from the coupling of bisphenol A and epichlorohydrin and of the type:
- alkoxylated bisphenol A di- and triglycidyl ethers of 1,6-hexanediol, of glycerol, of neopentyl glycol and of trimethylolpropane,
- or bisphenol A diglycidyl ethers,
- alpha-olefin epoxides, NOVOLAC epoxides, epoxidized soybean and linseed oil, and epoxidized polybutadiene, being particularly preferred, $\alpha_{2)}$ acrylates, taken alone or as a mixture with each other; e. g.:
- epoxidized acrylates, preferably the oligomer of bisphenol-A-epoxydiacrylate (EBECRYL 600),
- acrylo-glycero-polyester, preferably mixture of trifunctional acrylate oligomer obtained from glycerol and polyester (EBECRYL 810),
- multifunctional acrylates, preferably pentaerythrityl triacrylate (PETA), trimethylolpropane triacrylate (TMPTA), 1,6-hexanediol diacrylate (HDODA), trimethylolpropane ethoxylate triacrylate, thiodiethylene glycol diacrylate, tetraethylene glycol diacrylate (TTEGDA), tripropylene glycol diacrylate (TRPGDA), triethylene glycol diacrylate (TREGDA), trimethylolpropane trimethacrylate (TMPTMA),
- acrylo-urethanes,
- acrylo-polyethers,
- acrylo-polyesters,
- unsaturated polyesters,
- acrylo-acrylics, being particularly preferred, $\alpha_{3)}$ linear or cyclic alkenyl ethers, taken alone or as a mixture with each other:
- vinyl ethers, in particular triethylene glycol divinyl ether (RAPIDCURE® CHVE-3, GAF Chemicals Corp.), cyclic vinyl ethers or acrolein tetramers and/or dimers and the vinyl ether of the following formula:

$$\left[\!\!\!-O-(CH_2CH_2O)_{\overline{n}}-CH_2-CH_2-\underset{\underset{O}{|}}{\overset{Me}{\underset{|}{Si}}}\overset{Me}{\underset{}{\phantom{|}}}\underset{}{\overset{Me}{\underset{|}{Si}}}-CH_2CH_2-(OCH_2CH_2)_{\overline{n}}-O-\!\!\!\right]$$

- propenyl ethers,
- and butenyl ethers, being most especially preferred, $\alpha_{4)}$ polyols: taken alone or as a mixture with each other, preferably the compound of the formula given below:

Examples of reactive monomers and/or oligomers and/or polymers functionalized with epoxy and/or with an ethylenically unsaturated radical, such as an acrylate (cf. patent application EP 0,690,074).

Initiation of the photopolymerization and/or crosslinking of the composition according to the invention is made possible by means of the presence of the cationic and/or radical photoinitiator C.

The cationic photoinitiators can be chosen from the onium borates (taken alone or as a mixture with each other) of an element from groups 15 to 17 of the Periodic Table [Chem. & Eng. News, vol.63, N° 5, 26 of 4 Feb. 1985] or of an organometallic complex of an element from groups 4 to 10 of the Periodic Table [same reference], $\Delta$ whose cationic species is selected from:

1) the onium salts of formula (I):

$$[(R^1)_n\text{-}A\text{-}(R^2)_m]^+ \quad (I)$$

in which formula:

A represents an element from groups 15 to 17 such as, for exemple: I, S, Se, P or N, $R^1$ represents a $C_6$–$C_{20}$ carbocyclic or heterocyclic aryl radical, it being possible for the said heterocyclic radical to contain nitrogen or sulphur as hetero elements, $R^2$ represents $R^1$ or a linear or branched $C_1$–$C_{30}$ alkyl or alkenyl radical; the said radicals $R^1$ and $R^2$ optionally being substituted with a $C_1$–$C_{25}$ alkoxy, $C_1$–$C_{25}$ alkyl, nitro, chloro, bromo, cyano, carboxyl, ester or mercapto group, n is an integer ranging from 1 to v+1, v being the valency of the element A, m is an integer ranging from 0 to v−1 with n+m=v+1, 2) the oxoisothiochromanium salts described in patent application WO 90/11303, in particular the sulphonium salt of 2-ethyl-4-oxoisothiochromanium or of 2-dodecyl-4-oxoisothiochromanium, 3) the sulphonium salts in which the cationic species comprises:

$3_1$ at least one polysulphonium species of formula III.1:

$$Ar^1\!-\!\overset{+}{\underset{\underset{Ar^2}{|}}{S}}\!-\!Ar^3\!-\!Y\!-\!\!\left[\!Ar^3\!-\!\overset{+}{\underset{\underset{Ar^2}{|}}{S}}\!-\!Ar^1\right]_t \quad (III.1)$$

in which:
the symbols $Ar^1$, which may be identical to or different from each other, each represent a monovalent phenyl or naphthyl radical, optionally substituted with one or more radicals chosen from: a linear or branched $C_1$–$C_{12}$, preferably $C_1$–$C_6$, alkyl radical, a linear or branched $C_1$–$C_{12}$, preferably $C_1$–$C_6$, alkoxy radical, a halogen atom, an —OH group, a —COOH group, an ester group —COO-alkyl in which the alkyl portion is a linear or branched $C_1$–$C_{12}$, preferably $C_1$–$C_6$, residue, and a group of formula —$Y^4$—$Ar^2$ in which the symbols $Y^4$ and $Ar^2$ have the meanings given below, the symbols $Ar^2$, which may be identical to or different from each other or with $Ar^1$, each represent a monovalent phenyl or naphthyl radical, optionally substituted with one or more radicals chosen from: a linear or branched $C_1$–$C_{12}$, preferably $C_1$–$C_6$, alkyl radical, a linear or branched $C_1$–$C_{12}$, preferably $C_1$–$C_6$, alkoxy radical, a halogen atom, an —OH group, a —COOH group, an ester group —COO-alkyl in which the alkyl portion is a linear or branched $C_1$–$C_{12}$, preferably $C_1$–$C_6$, residue, the symbols $Ar^3$, which may be identical to or different from each other, each represent a divalent phenylene or naphthylene radical, optionally substituted with one or more radicals chosen from: a linear or branched $C_1$–$C_{12}$, preferably $C_1$–$C_6$, alkyl radical, a linear or branched $C_1$–$C_{12}$, preferably $C_1$–$C_6$, alkoxy radical, a halogen atom, an —OH group, a —COOH group, an ester group-COO-alkyl in which the alkyl portion is a linear or branched $C_1$–$C_{12}$, preferably $C_1$–$C_6$, residue, t is an integer equal to 0 or 1, with the additional conditions according to which:

+ when t=0, the symbol Y is then a monovalent radical $Y^1$ representing the group of formula:

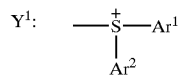

in which the symbols $Ar^1$ and $Ar^2$ have the meanings given above,

+ when t=1:
○ on the one hand, the symbol Y is then a divalent radical having the meanings $Y^2$ to $Y^4$ below:

$Y^2$: a group of formula:

in which the symbol $Ar^2$ has the meanings given above, $Y^3$: a single valency bond, $Y^4$: a divalent residue chosen from:

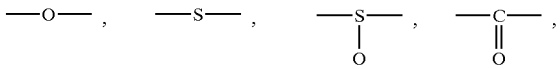

a linear or branched $C_1$–$C_{12}$, preferably $C_1$–$C_6$, alkylene residue and a residue of formula —Si(CH$_3$)$_2$O—, ○ on the other hand, in the specific case in which the symbol Y represents $Y^3$ or $Y^4$, the radicals $Ar^1$ and $Ar^2$ (terminal) have, besides the meanings given above, the possibility of being linked together via the residue Y' consisting of $Y'^1$ a single valency bond or of $Y'^2$ a divalent residue chosen from the residues mentioned with respect to the definition of $Y^4$, which is installed between the carbon atoms, opposite, located on each aromatic ring in an ortho position relative to the carbon atom directly linked to the cation $S^+$;

$3_2$ and/or at least one monosulphonium species having a single cationic centre $S^+$ per mole of cation and consisting, in most cases, of species of formula:

(III.2)

in which $Ar^1$ and $Ar^2$ have the meanings given above with respect to formula (III.1), including the possibility of connecting directly between them only one of the radicals $Ar^1$ to $Ar^2$ in the manner indicated above with respect to the definition of the additional condition in force when t=1 in formula (II), making use of the residue Y';

4) the organometallic salts of formula (IV):

$(L^1L^2L^3M)^{+q}$ (IV)

in which formula:

M represents a metal from groups 4 to 10, in particular iron, manganese, chromium, cobalt, etc.;

$L^1$ represents 1 ligand linked to the metal M via π electrons, this ligand being chosen from $\eta^3$-alkyl, $\eta^5$-cyclopentadienyl and $\eta^7$-cycloheptatrienyl ligands and the $\eta^6$-aromatic compounds chosen from optionally substituted $\eta^6$-benzene ligands and compounds containing from 2 to 4 fused rings, each ring being capable of contributing 3 to 8 π electrons to the valency shell of the metal M;

$L^2$ represents a ligand linked to the metal M via π electrons, this ligand being chosen from $\eta^7$-cycloheptatrienyl ligands and the $\eta^6$-aromatic compounds chosen from optionally substituted $\eta^6$-benzene ligands and compounds containing from 2 to 4 fused rings, each ring being capable of contributing 6 or 7 π electrons to the valency shell of the metal M;

$L^3$ represents from 0 to 3 identical or different ligands linked to the metal M via σ electrons, this (these) ligand(s) being chosen from CO and $NO_2^+$; the total electronic charge q of the complex to which $L^1$, $L^2$ and $L^3$ contribute and the ionic charge of the metal M being positive and equal to 1 or 2;

Δ the borate anionic species having the formula:

$[BX_aR_b]^-$ in which formula:

a and b are integers ranging, for a, from 0 to 3, and, for b, from 1 to 4, with a+b=4, the symbols X represent:
a halogen atom (chlorine or fluorine) with a=0 to 3,
an OH function with a=0 to 2, the symbols R are identical or different and represent:
a phenyl radical substituted with an electron-withdrawing group such as, for example, $OCF_3$, CF$_3$, NO$_2$ or CN, and/or with at least 2 halogen atoms (most particularly fluorine), and this being when the cationic species is an onium of an element from groups 15 to 17, a phenyl radical substituted with at least one element or an electron-withdrawing group, in particular a halogen atom (most particularly fluorine), CF$_3$, OCF$_3$, NO$_2$ or CN, and this being when the cationic species is an organometallic complex of an element from groups 4 to 10 an aryl radical containing at least two aromatic nuclei such as, for example, biphenyl or naphthyl, optionally substituted with at least one electron-withdrawing group or element, in particular a halogen atom (most particularly fluorine), OCF$_3$, CF$_3$, NO$_2$ or CN, irrespective of the cationic species.

Without this being limiting, further details regarding the subclasses of onium borate and of borate of organometallic salts more particularly preferred in the context of the use in accordance with the invention are given below.

Thus, as regards the borate anionic species, the species which are most particularly suitable are as follows:

| | | | |
|---|---|---|---|
| 1': | [B(C$_6$F$_5$)$_4$]$^-$ | 5': | [B(C$_6$H$_3$(CF$_3$)$_2$)$_4$]$^-$ |
| 2': | [(C$_6$F$_5$)$_2$BF$_2$]$^-$ | 6': | (B (C$_6$H$_3$F$_2$)$_4$]$^-$ |
| 3': | [B(C$_6$H$_4$CF$_3$)$_4$]$^-$ | 7': | [C$_6$F$_5$BF$_3$]$^-$ |
| 4': | [B(C$_6$F$_4$OCF$_3$)$_4$]$^-$ | | |

As regards the cationic species of the photoinitiator, the following are distinguished:
1) the onium salts of formula (I),
2) the oxoisothiochromanium salts of formula (II),
3) the mono- and/or polysulphonium salts of formula (III.1) and/or (III.2),
4) the organometallic salts of formula (IV).

The first species 1) are described in many documents, in particular in patents U.S. Pat. No. 4,026,705, U.S. Pat. No. 4,032,673, U.S. Pat. No. 4,069,056, U.S. Pat. No. 4,136,102 and U.S. Pat. No. 4,173,476. Among these, preference will be given most particularly to the following cations:

| | | |
|---|---|---|
| [(Φ)$_2$I]$^+$ | [C$_8$H$_{17}$—O-Φ-I-Φ]$^+$ | [(Φ-CH$_3$)$_2$ I]$^+$ |
| [C$_{12}$H$_{25}$-Φ-I-Φ]$^+$ | [(C$_8$H$_{17}$-Φ)$_2$ I]$^+$ | [(C$_8$H$_{17}$—O-Φ-I-Φ)]$^+$ |
| [(Φ)$_3$ S]$^+$ | [(Φ)$_2$-S-Φ-O-C$_8$H$_{17}$]$^+$ | [(CH$_3$-Φ-I-Φ-CH(CH$_3$)$_2$]$^+$ |
| [Φ-S-Φ-S-(Φ)$_2$]$^+$ | [(C H$_{25}$-Φ)$_2$ I]$^+$ | [(CH$_3$-Φ-I-Φ-OC$_2$H$_5$]$^+$ |

As regards the second family of cationic species of formule (II) and of oxoisothiochromanium type, it preferably comprises cations corresponding to the structure D$_1$ which is defined on page 14 of patent application WO-A-90/11303 and which has the formula (II):

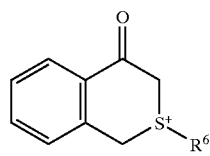

(II)

in which the radical R$^6$ has the meaning given in that WO patent application as regards the symbol R$^1$; a cationic species of this type which is more preferred is the one in which R$^6$ represents a linear or branched C$_1$–C$_{20}$ alkyl radical. As oxoisothiochromanium salts which are particularly suitable, mention will be made in particular of the sulphonium salt of 2-ethyl-4-oxoisothiochromanium or of 2-dodecyl-4-oxoisothiochromanium.

As regards the polysulphonium cationic species (III.1), it will be pointed out that the polysulphonium cationic species preferably comprises a species or a mixture of species of formula (III.1) in which:

the radicals Ar$^1$, which may be identical to or different from each other, each represent a phenyl radical optionally substituted with a linear or branched C$_1$–C$_4$ alkyl radical or with a group of formula:

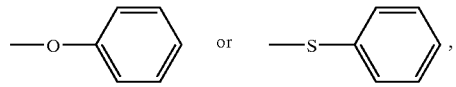

the radicals Ar$^2$, which may be identical to or different from each other and with Ar$^1$, each represent a phenyl radical optionally substituted with a linear or branched C$_1$–C$_4$ alkyl radical, the radicals Ar$^3$— each represent an unsubstituted para-phenylene radical, t is equal to 0 or 1, with the additional conditions according to which:

when t=0, Y=Y$^1$=:

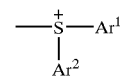

in which the radicals Ar$^1$ and Ar$^2$ have the preferred meanings given below in this paragraph;

when t=1:
on the one hand, Y=Y$^2$ to Y$^4$ with:

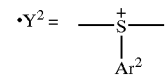

in which the radical Ar$^2$ has the preferred meaning given below in this paragraph, Y$^3$=a valency bond, Y$^4$=—O— or —S—, and on the other hand, when Y=Y$^3$ or Y$^4$ and when it is then desired to use radicals Ar$^1$ and Ar$^2$ (terminal) linked together, a link Y' consisting of a valency bond or an —O— residue is installed.

When they are present, the monosulphonium species which fall within the context of this preferred embodiment are the species of formula (IV) in which the symbols Ar$^1$ and Ar$^2$ have the preferred meanings given above in the preceding paragraph, including, when these radicals are directly linked together by a residue Y', the installation of a valency bond or an —O— residue.

As examples of cationic sulphonium species, mention may be made in particular of:

- 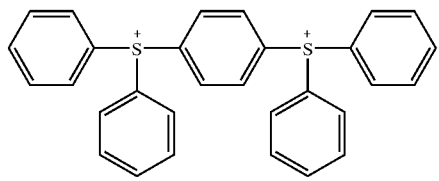
- 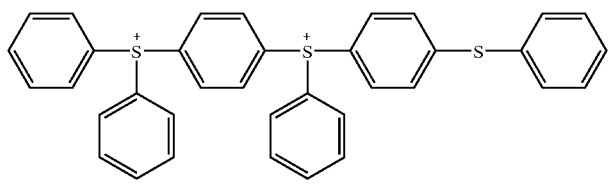
- 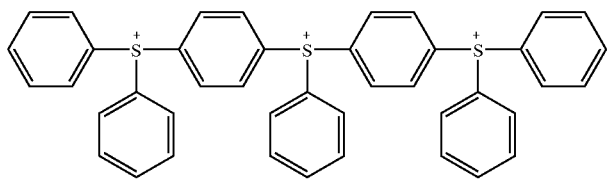
- 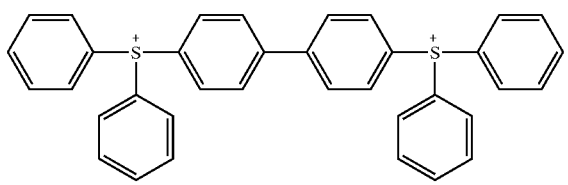
- 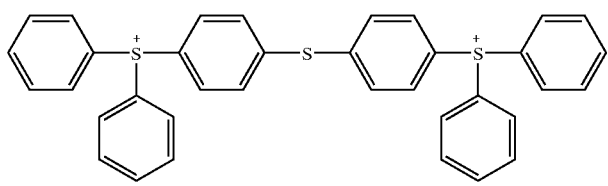
- 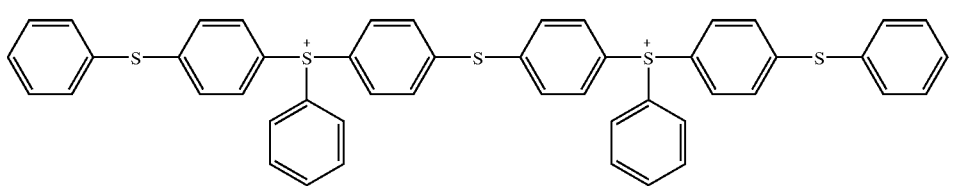
- 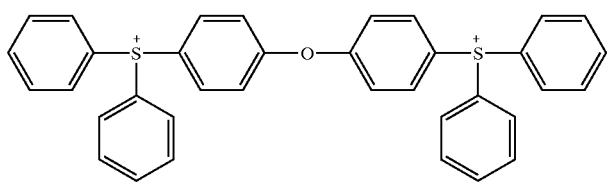

8

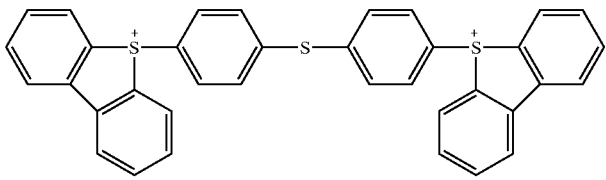

9

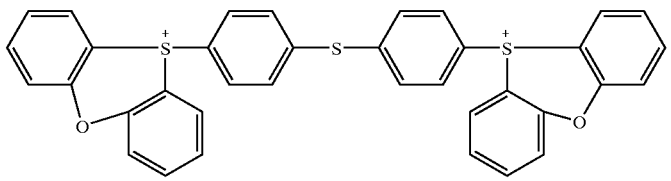

mixtures, in variable mounts, of species 5+2+optionally 3, mixtures, in variable amounts, of the species 5 with the species 10 of formula:

10

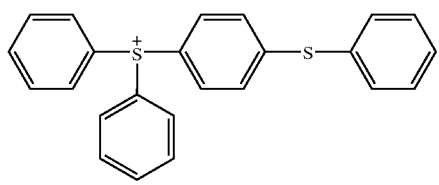

The borate anionic species is preferably chosen from the anions of formula $[BX_aR_b]^-$ in which:
the symbols X represent a fluorine atom,
the symbols R, which may be identical or different, represent a phenyl radical substituted with a least one electron-withdrawing group chosen from $OCF_3$, $CF_3$, $NO_2$ and CN, and/or with at least two fluorine atoms.

Given that the borate anionic species of formula $[BX_aR_b]^-$ is preferably chosen from the following anions: 1', 2', 3', 4', 5', 6', 7', the polysulphonium borates which will very probably be used are the salts formed by the combination of the following cations and anions:

| Cation | Anion |
|---|---|
| 5 | 1' |
| 5 | 3' |
| 5 | 4' |
| mixtures 5 + 10 | 1' |
| mixtures 5 + 10 | 3' |
| mixtures 5 + 10 | 4' |

These polysulphonium borates can be prepared by exchange reaction between a salt of the cationic species (halide such as, for example, chloride or iodide) with an alkali metal salt (sodium, lithium or potassium salt) of the anionic species.

The operating conditions (respective amounts of reagents, choice of solvents, duration, temperature, stirring) are within the capabilities of a person skilled in the art; they should make it possible to recover the desired polysulphonium borate in solid form by filtration of the precipitate formed or in oily form by extraction with the aid of a suitable solvent.

The procedures for synthesizing the halides of the cationic species of formula (III.1) are described in particular in: "*Polymer Bulletin (Berlin)*", vol. 14, pages 279–286 (1985) and U.S. Pat. No. 4,400,541.

According to an alternative concerning the preparation of the polysulphonium borates, these compounds can be-prepared directly by reaction between a diaryl sulphoxide and a diaryl sulphide according to the teaching described in: "*J. Org. Chem.*", Vol. 55, pages 4222–4225 (1990).

These novel polysulphonium borates can be used in the form in which they are obtained after the process for their preparation, for example in solid or liquid form or as a solution in a suitable solvent, in monomer/oligomer/polymer compositions which are intended to be cationically polymerized and/or crosslinked by activation, for example UV activation.

The monosulphonium species (III.2) under consideration above can be, in particular, the co-products which form during the preparation of the polysulphonium cations and whose presence can be more or less avoided.

Up to 99 mol %, more generally up to 90 mol % and even more generally up to 50 mol % (of cation) of the polysulphonium species of formula (III.1) can be replaced with monosulphonium species (III.2).

As regards the fourth type of cationic species, descriptions of this are given in patents U.S. Pat. No. 4,973,722 and U.S. Pat. No. 4,992,572 and European patent applications EP-A-203,829, EP-A-323,584 and EP-A-354,181. The organometallic salts more preferably selected in practice are, in particular:

($\eta^5$-cyclopentadienyl)($\eta^6$-toluene)$Fe^+$,
($\eta^5$-cyclopentadienyl)($\eta^6$-methyl-1-naphthalene)$Fe^+$,
($\eta^5$-cyclopentadienyl)($\eta^6$-cumene)$Fe^+$,
bis($\eta^6$-mesitylene)$Fe^+$,
bis($\eta^6$-benzene)$Cr^+$.

As examples of photoinitiators of the onium borate type, mention may be made of the following products:

| | |
|---|---|
| [(Φ)$_2$ I]$^+$, [B(C$_6$F$_5$)$_4$]$^-$ | [(C$_8$H$_{17}$)—O-Φ-I-Φ)]$^+$, [B(C$_6$F$_5$)$_4$]$^-$ |
| [C$_{12}$H$_{25}$-Φ-I-Φ]$^+$, [B(C$_6$F$_5$)$_4$]$^-$ | [(C$_8$H$_{17}$-O-Φ)$_2$I]$^+$, [B(C$_6$F$_5$)$_4$]$^-$ |
| [(C$_8$H$_{17}$)—O-Φ-I-Φ)]$^+$, [B(C$_6$F$_5$)$_4$]$^-$ | [(Φ)$_3$S]$^+$, [B(C$_6$F$_5$)$_4$]$^-$ |
| [(Φ)$_2$S-Φ-O—C$_8$H$_{17}$]$^+$, [B(C$_6$H$_4$CF$_3$)$_4$]$^-$ | [(C$_{12}$H$_{25}$-Φ)$_2$I]$^+$, [(C$_6$F$_5$)$_4$]$^-$ |
| [(Φ)$_3$ S]$^+$, [B(C$_6$F$_4$OCF$_3$ )$_4$]$^-$ | [(Φ-CH$_3$)$_2$I]$^+$, [B(C$_6$F$_5$)$_4$]$^-$ |
| [(Φ-CH$_3$)$_2$ I]$^+$, [B(C$_6$F$_4$OCF$_3$)$_4$]$^-$ | [CH$_3$-Φ-I-Φ-CH(CH$_3$)$_2$]$^+$, [B(C$_6$F$_5$)$_4$]$^-$ |
| ($\eta^5$ - cyclopentadienyl) ($\eta^6$ - toluene) Fe$^+$, [B(C$_6$F$_5$)$_4$]$^-$ | |
| ($\eta^5$ - cyclopentadienyl) ($\eta^6$ - methyl-1-naphthalene) Fe$^+$, [B(C$_6$F$_5$)$_4$]$^-$ | |
| ($\eta^5$ - cyclopentadienyl) ($\eta^6$ - cumene) Fe$^+$, [B(C$_6$F$_5$)$_4$]$^-$ | |

As another literature reference for defining the onium borates 1) and 2) and the borates of organometallic salts 4), selected as photoinitiator in the context of the SPL use according to the invention, mention may be made of the entire content of patent applications EP 0,562,897 and EP 0,562,922. This content is incorporated in its entirety by reference in the present specification.

As further examples of onium salts which can be used as photoinitiator C, mention may be made of those disclosed in U.S. Pat. Nos. 4,138,255 and 4,310,469 (Crivello).

It is also possible to use other cationic photoinitiators, e.g.:

those sold by Union Carbide (photoinitiator 6990 and 6974 triarylsulphonium hexafluorophosphate and hexafluoroantimonate), the iodonium hexafluorophosphate or hexafluoroantimonate salts, or the ferrocenium salts of these various anions.

The radical photoinitiators used are based on benzophenones. Examples which may be mentioned are those sold by Ciba-Geigy:

Irgacure 184,
Irgacure 500,
Darocure 1173,
Irgacure 1700,
Darocure 4265,
Irgacure 907,
Irgacure 369,
Irgacure 261,
Irgacure 784 DO,
Irgacure 2959,
Irgacure 651.

The radical photoinitiators can contain one or more phosphorus atoms, such as those sold by Ciba-Geigy (Irgacure 1700) or BASF (Lucirin TPO).

In accordance with the invention, the proportions of compounds A, B and C are as follows:

| | | |
|---|---|---|
| A: | 59–97.99%, | preferably 70–97.9% (weight percent), |
| B: | 39–1%, | preferably 29–1% (weight percent); |
| C: | 2–0.01%, | preferably 1–0.1% (weight percent). |

Various combinations are possible as regards the matrix A and the diluent B of the composition according to the invention.

Preferably, the composition comprises:

a matrix (A) based on a mixture of at least one of the following species: epoxides ($\alpha_1$), acrylates($\alpha_2$), vinyl ethers ($\alpha_3$), polyols ($\alpha_4$), preferably ($\alpha_1$) and ($\alpha_2$), and a silicone diluent (B) in which the functions frB are epoxy and/or acrylate and/or vinyl ether and/or hydroxyl, preferably epoxy and/or acrylate.

It goes without saying, in the case in which the species used are ($\alpha_1$) and/or ($\alpha_3$), that the photoinitiator (C) is then of the cationic type, whereas, for the species ($\alpha_2$) and ($\alpha_4$) the photoinitiator (C) is of the radical type.

In practice, it is thus possible, for example, to combine monomers and/or oligomers and/or polymers of the matrix A containing epoxy and acrylate functions frA, with a first diluent B containing epoxy functions and a second diluent B containing acrylate functions.

According to one variant, the epoxy and acrylate functions frA can be borne by different comonomers of the matrix A.

Avantageously, the photoinitiator C is used in solution in an organic solvent (accelerator), preferably chosen from proton donors and, even more preferably, from the following groups: isopropyl alcohols, benzyl alcohols, diacetone alcohol, butyl lactate and mixtures thereof.

Besides the photoinitiator(s) C, the composition according to the invention can optionally comprise at least one photosensitizer D selected from (poly)aromatic products— optionally metallic— and heterocyclic products and, preferably, chosen from the list of following products: phenothiazine, tetracene, perylene, anthracene, 9,10-diphenylanthracene, thioxanthone, 2-chlorothio-9-xanthenone, 1-chloro-4-propoxy-9H-thio-9-xanthenone, isopropyl-OH-thio-9-xanthenone, isomeric mixtures 2 and 4, 2-isopropyl-9H-thio-9-xanthenone, benzophenone, [4-(4-methylphenylthio)phenyl]phenylmethanone, 4-benzyl 4'-methyldiphenyl sulphide, acetophenone, xanthone, fluorenone, anthraquinone, 9,10-dimethylanthracene, 2-ethyl-9,10-dimethyloxyanthracene, 2,6-dimethylnaphthalene, 2,5-diphenyl-1-3-4-oxadiazole, xanthopinacol, 1,2-benzanthracene and 9-nitroanthracene, and mixtures thereof.

For the purposes of the invention, the expression "effective amount of initiator system" means the amount which is sufficient to initiate the crosslinking. Advantageously, this effective amount corresponds to $1 \times 10^{-4}$ to 1, preferably from $1 \times 10^{-3}$ to $1 \times 10^{-1}$ and even more preferably from $1 \times 10^{-3}$ to $1 \times 10^{-2}$ mol of photoinitiator per 1 mol of function frA and frB.

In the case of using a photosensitizer D, the appropriate concentration ranges for the latter are:

$1 \times 10^{-4}$ to $1 \times 10^{-1}$ mol/mole of function frA and frB, preferably from $1 \times 10^{-4}$ to $1 \times 10^{-2}$ mol/mole of frA and frB, and, even more preferably, from $1 \times 10^{-4}$ to $1 \times 10^{-3}$ mol/mole of frA and frB.

To illustrate what the possibilities are for the optional ingredients, which are the pigments in E in the composition according to the invention, mention will be made, for example, of the following products: titanium dioxide, kaolin, calcium carbonate, black iron oxide, nitrogenous barium salts, aluminium pigments, calcium borosilicate, carbanzole violet, azo pigments, red iron oxide, yellow iron oxide, diazo, naphthol, carbon black, baryta, dianisidine, monoarylide, pyrazolone, toluidine, calcium red, nitrogenous calcium salts, nitrogenous barium salts, diarylide, monoarylide, phthalocyanin, benzimidazoline, bronze powder, rhodamine.

The pigmented compositions according to the invention are, for example, inks. Titanium dioxide allows a white ink to be obtained.

As regards the other optional additives F, mention may be made, by way of example, of dyes, fillers (silicone or non-silicone fillers), surfactants, mineral reinforcing fillers (which are siliceous or non-siliceous), bactericides, corrosion inhibitors, binder bases, organosilicon compounds or epoxidized compounds, such as alkoxy silanes, epoxycycloaliphatics or epoxy ether aliphatics.

As regards, more particularly, the case of varnishes, these are, needless to say, free of pigments when they are clear varnishes. In general, the varnishes comprise at least one surfactant and, advantageously, a specific combination of monomeric, oligomeric and polymeric products in the matrix A, i.e. at least one cycloaliphatic epoxide and, optionally, at least one epoxide obtained from the coupling of bisphenol A with an epichlorohydrin.

In a manner which is known per se, the varnishes can include in their compositions: flexibilizing agents and/or levelling agents (products sold by Byk Chemie or EFKA Chem., for example BYK 306, 307, 361, EFKA 31, EFKA 35) and/or adhesion promoters: e.g. silanes of the Glymo type:

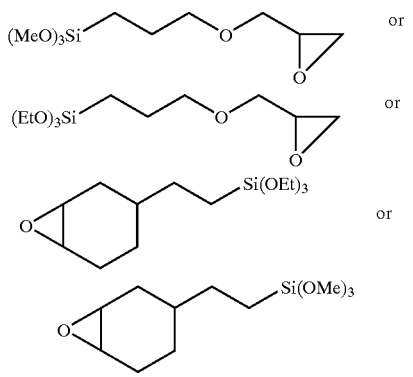

According to an advantageous feature of the invention, the flexibilizing agent(s) and/or the levelling agent(s) and/or the adhesion promoter(s) can comprise, totally or partially, the reactive diluent in B e.g. of formula I.1 as described above.

The diluent B can thus assume the functions fulfilled by these various functional additives. This multifunctionality is all the more advantageous since it requires no excess of diluent B. Low doses are sufficient.

According to another of its aspects, the present invention relates to a silicone diluent B, as defined above, for the preparation of a composition, preferably an ink or a varnish, which can undergo cationic and/or radical polymerization and/or crosslinking by irradiation, preferably actinic irradiation, and/or by a beam of electrons, the said composition also comprising compounds A and C and, optionally, D, E and F targetted above.

The examples which follow will make it possible to gain a better understanding of the invention and bring forth all of its advantages and see a few of its embodiments.

EXAMPLES

I—Starting Materials

Figure 1:
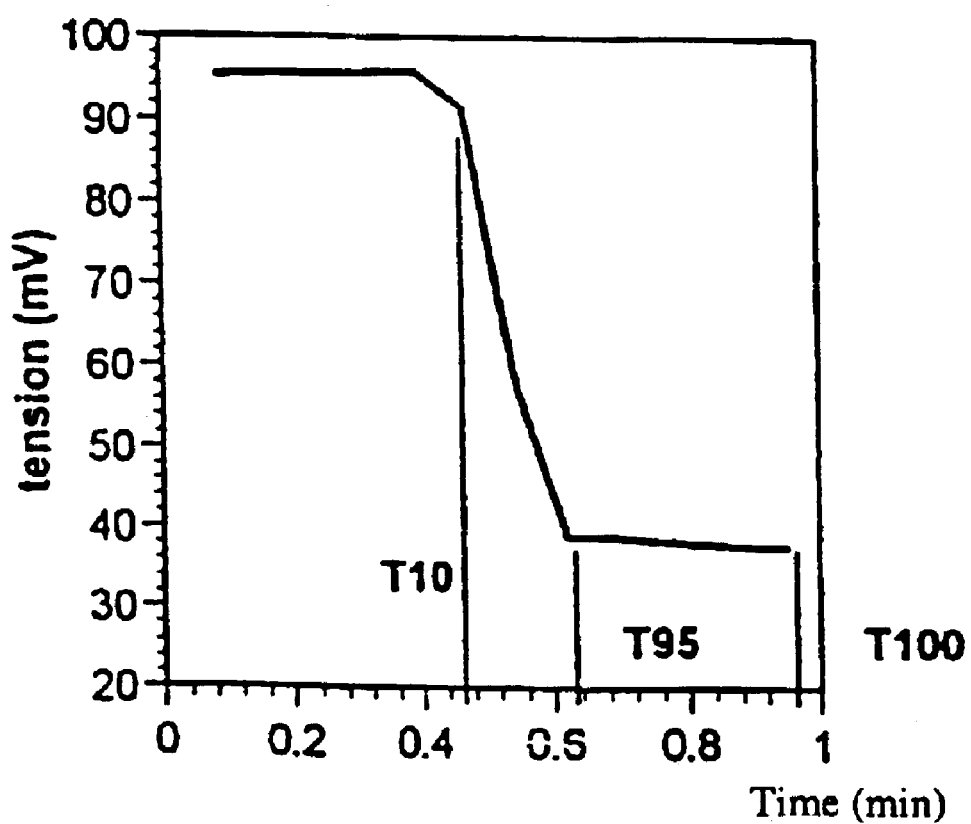
FIG. 1 illustrates the crosslinking of a composition of the invention throughout an UV exposure.

I.1—Matrix (A):

$\alpha_{1.1}$—Monomers with frA=epoxy:

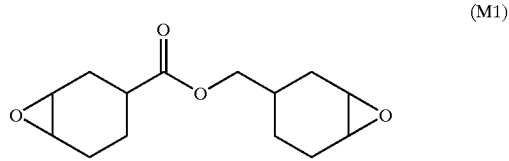

(M1)

(M1) is sold by the company Union Carbide (UVR 6105 and 6110).

$\alpha_2$—frA: oligomer/epoxyacrylate of the type:

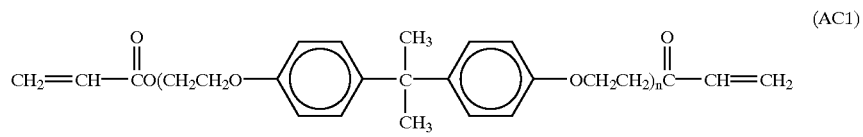

(AC1)

Bisphenol containing epoxydiacrylate oligomer (Ebecryl 600).

$\alpha_2$—Monomers containing frA=acrylate:

Mixture of trifunctional oligomeric acrylate obtained from glycerol and polyester sold, for example, by Union Chemique Belge (UCB) (Ebercryl 810) (AC2).

$\alpha_4$—Monomers containing frA=OH:

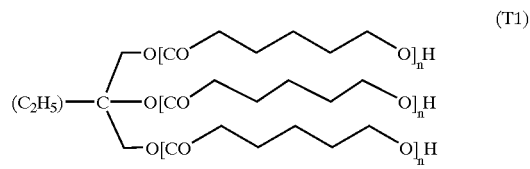

(T1)

(T1) is sold by the company Union Carbide (TON 301).

I.2—Diluent (B):

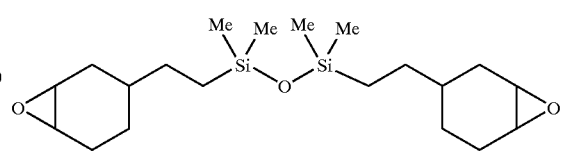

1)

This siloxane a) can be obtained by hydrosilylation of vinylcyclohexene monoxide with tetramethyldihydrogeno-1,3-disiloxane, has a flash point of 200° C.

2)

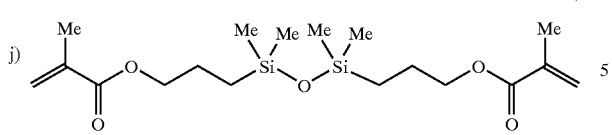

I.3—Photoinitiator C:
Photoinitiator (P1) (bis+90% w/w and mono. 10% w/w)

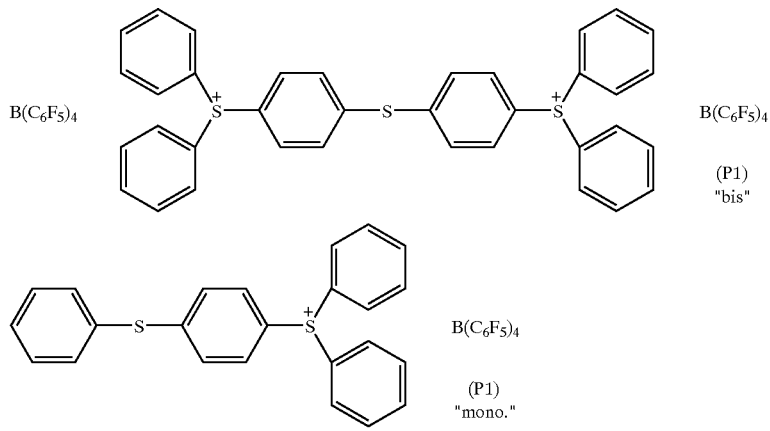

at 20% in butyl lactate.
The cationic photoinitiator used has the following formula:

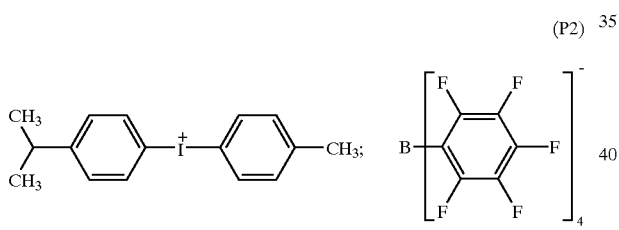

(P2)

The radical photoinitiator (P3) is the one sold by Ciba-Geigy (Darocure 1173).
P2 is soluble in P3.
P1, P2, P3 are used in the form of a solution in butyl lactate or isopropanol.

I.4—Photosensitizer (D):
CPTX=1-chloro-4-propoxythioxanthone.

I.5—Pigment (E):
Concentrated pigment base. A concentrated pigment base is obtained by dispersing:
  700 parts of titanium oxide of rutile type sold by Dupont (R960),
  3.5 parts of a dispersing agent sold by Zeneca (Solsperse 24000C)
  296.5 parts of cycloaliphatic epoxy resin (M1) sold by Union Carbide (UVR6105),
in a 2 liter reactor fitted with a central 3-blade stirrer.
  The concentrated pigment base is obtained by mixing for half an hour after pouring the titanium oxide powder on to the resin/dispersing agent mixture preheated to 40° C.

I.6—Other Additives (F):
Levelling agent sold by the company BYK (BYK 306, BYK 307 or BYK 361) or by the company EFKA (EFKA 35).

Wetting agent based on polyether silicone, sold by the company OSI (Silwet L 7640 or L7644).

II—Evaluation of the Properties of the Composition

RAPRA Test—rate of Crosslinking:
  An illustration of the various rates of crosslinking is given using films 4 to 25 μm thick obtained on a UV machine equipped with a Fusion lamp of H type. The rate of crosslinking at a given throughput speed and at a measured irradiation dose is recorded. It is also possible to crosslink in a layer 2 mm thick using a high-pressure mercury arc lamp connected to an optical fibre 8 mm in diameter, sold by the company EFOS (Ultracure 100SS). The optical fibre is connected to the measuring tank of an RAPRA machine (VNC or Vibrating Needle Curemeter). The vibrating needle penetrates into the epoxy matrix (1 cm$^3$) and a potential difference is measured according to the degree of crosslinking at a given frequency of vibration, which is 40 Hz. When irradiation is carried out, the medium reaches the gel point very quickly. This is reflected by a change in the measured potential. The curve of change in potential is recorded throughout the UV exposure and the time which corresponds to 95% of the total change (T95) is reported, i.e. for example, 0.6 minutes in the attached FIG. 1.

Test with MEK:

This test with methyl ethyl ketone, MEK, consists in measuring the number of to-and-fro motions which can be carried out on the surface of the varnish with a paper (cellulose wadding) soaked in methyl ethyl ketone (MEK) before the varnish is completely degraded.

Flexibility of the Layers by Folding on a Cylindrical Mandrel According to AFNOR Standard No. T30-040.

Example 1

The diluent a) is fully miscible in the epoxy matrix (M1) or the polyol matrix (T1).

The behaviour of the crosslinking under ultraviolet light of different formulations in the presence of a sulphonium borate of formula (P1) is studied.

The three formulations prepared comprise:

| | | |
|---|---|---|
| (F1) | 5 parts | (a) |
| | 95 parts | (M1) |
| (F2) | 10 parts | (a) |
| | 90 parts | (M1) |
| (F3) | 20 parts | (a) |
| | 80 parts | (M1) |
| (CF) control formulation | 100 parts | (M1) |

0.5 p of a wetting agent based on polyether silicone, sold by the company OSI (Silwet L7640 or L7644) and a solution of photoinitiator in vinyl lactate are added to these formulations so as to have a given concentration, the value of which is specified later in Table I.

The crosslinking is studied in a thick layer (RAPRA (V. N. C.)) and as a thin layer. 5, 10 and 20 μm films are prepared using threaded coating bars (Bar 0, 2 or 3) on an aluminium support. A few drops of composition are used and the aluminium support is degreased by cleaning with propanol or isopropanol.

Crosslinking tests with a vibrating needle are carried out in a tank 10×10×40 mm in size using 1 cm$^3$ of composition poured into the tank. The bottom of the tank is connected to a mercury vapour lamp (high-pressure) via an optical fibre. The needle penetrates down to 2 mm from the bottom of the tank which receives the beam of light.

The results obtained during the various crosslinking tests on exposure to ultraviolet light are collated in Table I below.

With the Fusion lamp (type "H"), the minimum exposure time at a given throughput speed to go from the liquid state to the non-sticky solid state is recorded. The degree of crosslinking of the films obtained is also defined, by the test with methyl ethyl ketone (MEK). With the mercury vapour arc lamp, in the case of the crosslinking as a 2 mm thick layer with RAPRA (vibrating needle), the minimum exposure time to reach 95% crosslinking (T95 defined above) is recorded.

TABLE I

| Test | Photo-initiator | Lamp "H" (Fusion) (120 W/cm)* | MEK (test)** | Rapra (V.N.C) dose: 1.1 J/cm$^2$ T95 in s |
|---|---|---|---|---|
| F1 (5 μm) | 2.5 × 10$^{-3}$ | >52 m/min | 4 h/>200 | 245 |
| F1 (10 μm) | mol/l | 52 m/min 3 passes | 4 h/>200 | |
| F1 (10 μm) | | 23 m/min 2 passes | 4 h/>200 | |
| F2 (5 μm) | 2.5 × 10$^{-3}$ | >52 m/min | 4 h/>200 | 245 |
| F2 (10 μm) | mol/l | 52 m/min 3 passes | 4 h/>200 | |
| F2 (10 μm) | | 23 m/min 2 passes | 4 h/>200 | |
| F3 (5 μm) | 2.5 × 10$^{-3}$ | >52 m/min | 4 h/>200 | 210 |
| F3 (10 μm) | mol/l | 52 m/min 3 passes | 4 h/>200 | |
| F3 (10 μm) | | 23 m/min 2 passes | 4 h/>200 | |
| FT (5 μm) | 2.5 × 10$^{-3}$ | >52 m/min | 4 h/>200 | 245 |
| FT (10 μm) | mol/l | 52 m/min 3 passes | 4 h/>200 | |
| FT (10 μm) | | 23 m/min 2 passes | 4 h/>200 | |

*passes = number of passages required at the speed considered in order to obtain a touch-dry surface,
**MEK: >200. After 100 to-and-fro motions, the film is still intact. Storage time at 20° C. after irradiation at the end of which the measurement is taken.
All the supplemented formulations crosslink perfectly in the presence of this epoxidized silicone, the viscosity of which is 50 mPa · s.

Example 2

The rate of crosslinking and the nature of the network obtained after adding T1 to the matrix (A) in addition to M1, which makes it possible to improve the flexibility of the resin after crosslinking, is now compared.

The ratio [OH]/[epoxy]=¼.

The new control formulation (C'F) becomes:

| | | |
|---|---|---|
| | 85 parts of | (M1), |
| | 15 parts of | (T1). |
| Various amounts of silicone diluent (a) are added: | | |
| (F'1) | 80.75 parts of | (M1), |
| | 14.25 parts of | (T1), |
| | 5 parts of | (a), |
| (F'2) | 76.5 parts of | (M1), |
| | 13.5 parts of | (T1), |
| | 10 parts of | (a), |
| (F'3) | 68 parts of | (M1), |
| | 12 parts of | (T1), |
| | 20 parts of | (a). |

0.5 p of the same wetting agent (Silwet L7640) as in the preceding example and a fixed known amount of photoinitiator are added.

The same lamps as previously are used.

The results obtained during the various tests are collated in Table II below.

TABLE II

| Test Film (e μm) | Photo-initiator | Lamp "H" (Fusion) (120 W/cm)* | MEK (test)** | Impact strength 24 h inch-21 | Pencil hardness/ Persoz 24 h |
|---|---|---|---|---|---|
| F'1 (20 μm) | 5 × 10$^{-3}$ mol/l | 3 m/min: 1 pass. | 1 h/100 | 15 | H/269 |
| F'2 (20 μm) | 5 × 10$^{-3}$ mol/l | 8 m/min: 1 pass. | 1 h/88 | 20 | H/250 |
| F'3 (20 μm) | 5 × 10$^{-3}$ mol/l | 23 m/min: 1 pass. | 1 h/80 | 30 | H/346 |
| F'T (20 μm) | 5 × 10$^{-3}$ mol/l | 3 m/min: 1 pass. | 1 h/130 | 10 | H/230 |

*1 pass.: limiting throughput speed of the conveyor which makes it possible to obtain a touch-dry surface in a single passage,
**MEK: duration of storage at 20° C. after irradiation at the end of which the measurement is taken (1 hour). Maximum limiting number of to-and-fro motions which the film can tolerate.

It is seen, in particular, that the silicone (a) makes it possible to increase the rate of crosslinking and the hardness of the films, while at the same time improving the impact strength (before).

In particular, it is not necessary to add a lot of silicone (a) ≦30% w/w in order to obtain a spectacular effect.

Example 3

The effect of (a) added in an organic matrix based on cycloaliphatic epoxides (M1), polyol (T1) and in the presence of a levelling agent (BYK 306) is also evaluated.

In this example, the photoinitiator is an iodonium borate of formula (P2) added as a 33% w/w solution in isopropanol:

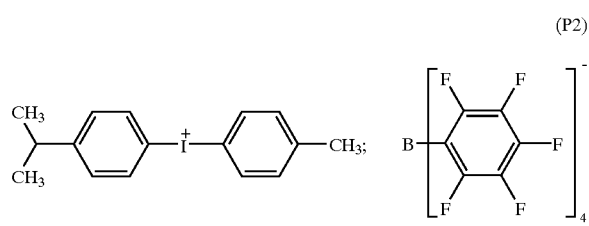
(P2)

The following formulations were evaluated using RAPRA (cf. Table III and Table IV) for 0.5% and 1% of photoinitiator, respectively.

TABLE III

| Reference | F4 | F5 | F6 |
|---|---|---|---|
| M1 % | 82.7 | 66.1 | 57.45 |
| T1 % | 14.7 | 11.6 | 10.40 |
| Byk 306% | 1.1 | 0.8 | 0.65 |
| P2 % | 0.5 | 0.5 | 0.5 |
| a) in % | 0 | 20 | 30 |
| Isopropanol % | 1.0 | 1.0 | 1 |
| Rapra (V.N.C) dose 0.4 J/cm$^2$ T95 s | 690 | 510 | 420 |

TABLE IV

| Reference | F7 | F8 | F9 |
|---|---|---|---|
| M1 % | 81.4 | 64.8 | 56.3 |
| T1 % | 14.7 | 11.4 | 10.1 |
| Byk 306% | 1.1 | 0.8 | 0.6 |
| P2 % | 1 | 1 | 1 |
| a) in % | 0 | 20 | 30 |
| Isopropanol % | 2 | 2 | 2 |
| Rapra (V.N.C) dose 0.4 J/cm$^2$ T95 s | 180 | 150 | 130 |

Example 4

Formulation and Evaluation of White Inks Containing a Reactive Diluent of the Type Claimed According to the Invention.

This concentrated pigment base is formulated with or without siloxane diluent (a).

TABLE V

| Reference | F10 | F11 |
|---|---|---|
| Conc. pigment base E % | 78 | 78 |
| Diluent a) in % | 10 | 0 |
| T1 % | 0 | 5 |
| M1 % | 7.9 | 12.9 |
| BYK 361% | 1.5 | 1.5 |
| P2 % | 1 | 1 |
| CPTX* % | 0.6 | 0.6 |
| Isopropanol % | 1 | 1 |

*CPTX = 1-chloro-4-propoxythioxanthone used as photosensitizer.

The photoinitiator is added in the form of an isopropanol solution.

The various constituents are added and mixed together until dissolution of the thioxanthone CPTX is complete, before adding the concentrated pigment base.

The drying of the inks is evaluated on a UV machine from the company Fusion, fitted with a gallium-doped mercury lamp. This lamp, which has a power rating of 120 W/cm, was calibrated using a Powerpack cell from the company EIT, so as to determine the intensity and the dose received as a function of the throughput speed of the machine.

At a throughput speed of 23 m/min, the sample receives:
UVA(320–390 nm)=0.157 J/cm$^2$; UVB(280–320 nm)= 0.068 J/cm$^2$;
UVC(250–260 nm)=0.013 J/cm$^2$; UVV(390–440 nm)= 0.490 J/cm$^2$.

At a throughput speed of 43 m/min, the sample receives:
UVA(320–390 nm)=0.088 J/cm$^2$; UVB(280–320 nm)= 0.038 J/cm$^2$;
UVC(250–260 nm)=0.006 J/cm$^2$; UVV(390–440 nm)= 0.416 J/cm$^2$.

The resistance to solvents of the inks obtained after drying 12±3 μm films is measured, by measuring the number of to-and-fro motions required, carried out using a cloth soaked in solvent to disintegrate the ink layer, 1 hour after exposure and 24 hours after exposure. In this case, the solvent used is methyl ethyl ketone (MEK).

TABLE VI

| Speed; formulation | 23 m/min; F10 | 23 m/min; F11 | 43 m/min; F10 | 43 m/min; F11 |
|---|---|---|---|---|
| Crosslinking | OK 1 pass | OK 1 pass | OK 1 pass | OK 1 pass |
| MEK (1 h) | 70 | 25 | 30 | 5 |
| MEK (24 h) | >200 | 80 | >200 | 50 |
| Ø (mm) smallest mandrel cylinder | 3 mm | 3 mm | 3 mm | 3 mm |

Example 5

Hybrid Formulations of the Matrix (A) Based on Epoxy/Acrylate with an Epoxy Diluent.

Table VII below gives the compositions of the tests F12 to F17.

TABLE VII

| Reagents (%) | | F12 | F13 | F14 | F15 | F16 | F17 |
|---|---|---|---|---|---|---|---|
| Matrix A | (AC2) | 97 | 96 | 30 | 30 | 30 | 76 |
| | M1 | 0 | 0 | 56 | 53.4 | 39 | 0 |
| | T1 | 0 | 0 | 10 | 9.6 | 7 | 0 |
| Diluent a) | O | 0 | 0 | 0 | 0 | 20 | 20 |
| Photo-initiator | P2 | 0 | 1 | 1 | 1 | 1 | 1 |
| | P3 | 3 | 3 | 3 | 3 | 3 | 3 |
| | Isopropanol | 0 | 0 | 0 | 3 | 0 | 0 |

Drying of These Hybrid Formulations:

The drying of the inks is evaluated on a UV machine from the company IST, fitted with two 200 W/cm lamps; a gallium-doped mercury lamp and an undoped mercury lamp.

At a throughput speed of 23 m/min, the sample receives:
UVA(320–390 nm)=0.372 J/cm$^2$; UVB(280–320 nm)= 0.334 J/cm$^2$;
UVC(250–260 nm)=0.044 J/cm$^2$; UVV(390–440 nm)= 0.662 J/cm$^2$.

At a throughput speed of 43 m/min, the sample receives:
UVA(320–390 nm)=0.145 J/cm$^2$; UVB(280–320 nm)= 0.145 J/cm$^2$;
UVC(250–260 nm)=0.018 J/cm$^2$; UVV(390–440 nm)= 0.343 J/cm$^2$.

At a speed of 100 m/min, the calibration is not significant, given the response time of the cell. The resistance to solvents of the inks obtained after drying 12 μm films on aluminium (Bar No. 2) is measured by noting the number of to-and-fro motions required, carried out using a cloth soaked in solvent to disintegrate the layer of ink after half an hour. In this case, the solvent used is methyl ethyl ketone (MEK).

The evaluation results without a cover of nitrogen are as follows.

TABLE VIII

| Reagents (%) | F12 | F13 | F14 | F15 | F16 | F17 |
|---|---|---|---|---|---|---|
| V (m/min) | 100 | 100 | 100 | 100 | 100 | 100 |
| MEK | >100 | >100 | 40 | 40 | 50 | 40 |
| Adhesion* | 3 | 3 | 1 | 1 | 0 | 0 |
| V (m/min) | 50 | 50 | 50 | 50 | 50 | 50 |
| MEK | >100 | >100 | 70 | 90 | 100 | 80 |
| Adhesion | 3 | 3 | 1 | 1 | 3 | 3 |

*Adhesion according to NFT 30038:
5 + 0% adhesion,
0 = 100% adhesion.

The siloxane diluent (a) makes it possible, by virtue of its low viscosity, to facilitate the spreading on the support and the mixing of the constituents.

The formulations using the reactive diluent noted as (a) have particularly advantageous behaviour on drying. They lead to better adhesion without a major loss of setting speed or of resistance to the solvent.

Example 6
Radical Formulations with a Matrix (A) Based on Acrylates.

The drying of the inks is evaluated on a UV machine from the company IST, fitted with two 200 W/cm lamps; a gallium-doped mercury lamp and an undoped mercury lamp.

The calibration of the lamps is the same as previously.
The formulations used are described in Table IX below.

TABLE IX

| Reagents % | | F18 | F19 | F20 | F21 |
|---|---|---|---|---|---|
| Matrix A | (AC1) | 97 | 96 | 0 | 28.5 |
| | (AC2) | 0 | 0 | 85.3 | 59 |
| Diluent j | | 0 | 0 | 10.9 | 7.5 |
| Photoinitiator P3 | | 3 | 4 | 3.7 | 5 |
| V (m/min) | | 100 | 100 | 100 | 100 |
| MEK | | no surface cure | no surface cure | no surface cure | 35 |
| Adhesion * | | not applicable | not applicable | 5 | 5 |
| V (m/min) | | 50 | 50 | 50 | 5 |
| MEK | | no surface cure | no surface cure | 10 | 60 |
| Adhesion | | not applicable | not applicable | 5 | 5 |

* Adhesion according to NFT 30038:
5 = 0% adhesion,
0 = 100% adhesion.

The evaluation results without a cover of nitrogen are as follows.

The siloxane diluent (P) allows very good incorporation of AC1 without harming the polymerization.

What is claimed is:

1. A composition capable of undergoing cationic polymerisation or radical polymerisation, and crosslinking by irradiation, or by beams of electrons, comprising:

(A) at least one polymerisable organic matrix or at least one partially polymerised organic matrix, comprising monomers, comonomers, oligomers, cooligomers, polymers, or copolymers having epoxy functions (frA);

(B) at least one silicone diluent with a viscosity ηr at 25° C. of less than or equal to 200 mPa·s, and comprising:
at least one unit of formula (I):

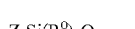

$$Z\text{-}Si(R^0)_a O_{(3-a)/2}$$

wherein:

a=0, 1 or 2, $R^0$ is independently an alkyl, cycloalkyl, aryl, vinyl, hydrogeno or alkoxy radical, Z is an organic substituent comprising at least one acrylate or alkenyl ether (frB); and at least two silicon atoms; and (C) an effective amount of at least one cationic or radical photoinitiator which is an onium borate of an element from groups 15 to 17 of the Periodic Table or of an organometallic complex of an element from groups 4 to 10 of the Periodic Table, and wherein the onium is the sulphonium salt of 2-ethyl-4-oxoisothiochromanium or of 2-dodecyl-4-oxoisothiochromanium.

2. A composition capable of undergoing cationic polymerisation or radical polymerisation, and crosslinking by irradiation, or by beams of electrons, comprising:

(A) at least one polymerisable organic matrix or at least one partially polymerised organic matrix, comprising monomers, comonomers, oligomers, cooligomers, polymers, or copolymers having epoxy functions (frA);

(B) at least one silicone diluent with a viscosity ηr at 25° C. of less than or equal to 200 mPa·s, and comprising:

at least one unit of formula (I):

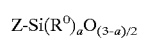

$$Z\text{-}Si(R^0)_a O_{(3-a)/2}$$

wherein:

a=0, 1 or 2, $R^0$ is independently an alkyl, cycloalkyl, aryl, vinyl, hydrogeno or alkoxy radical, Z is an organic substituent comprising at least one acrylate or alkenyl ether (frB); and at least two silicon atoms; and (C) an effective amount of at least one cationic or radical photoinitiator which is an onium borate of an element from groups 15 to 17 of the Periodic Table or of an organometallic complex of an element from groups 4 to 10 of the Periodic Table, and wherein the onium is a sulphonium salt comprising a cationic species, wherein the cationic species comprises:

at least one polysulphonium species of formula III.1:

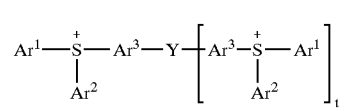

$$Ar^1 \overset{+}{\underset{Ar^2}{-S}} - Ar^3 - Y - \left[ Ar^3 \overset{+}{\underset{Ar^2}{-S}} - Ar^1 \right]_t \quad (III.1)$$

wherein:

the symbols $Ar^1$, which are identical to or different from each other, each represents a monovalent phenyl or naphthyl radical, optionally substituted with one or more radicals chosen from: a linear or branched $C_1$–$C_{12}$, alkyl radical, a linear or branched $C_1$–$C_{12}$, alkoxy radical, a halogen atom, an —OH group, a —COOH group, an ester group —COO-alkyl in which the alkyl portion is a linear or branched $C_1$–$C_{12}$, and a group of formula —$Y^4$—$Ar^2$ in which the symbols $Y^4$ has the meaning given below and $Ar^2$, which may be identical to or different from each other, each represents a monovalent phenyl or naphthyl radical, optionally substituted with one or more radicals chosen from: a linear or branched $C_1$–$C_{12}$, alkyl radical, a linear or branched $C_1$–$C_{12}$ alkoxy radical, a halogen atom, an —OH group, a —COOH group, an ester group —COO-alkyl in which the alkyl portion is a linear or branched $C_1$–$C_{12}$, the symbols $Ar^3$, which are identical to or different from each other, each represent a divalent phenylene or naphthylene radical, optionally substituted with one or more radicals chosen from: a linear or branched $C_1$–$C_{12}$ alkyl radical, a linear or branched $C_1$–$C_{12}$ alkoxy radical, a halogen atom, an —OH group, a —COOH group, an ester group-COO-alkyl in which the alkyl portion is a linear or branched $C_1$–$C_{12}$, t is an integer equal to 0 or 1, with the additional conditions according to which:

when t=0:
the symbol Y is then a monovalent radical $Y^1$ representing the group of formula:

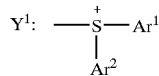

$Y^1$:

wherein the symbols $Ar^1$ and $Ar^2$ have the meanings given above, when t=1:
the symbol Y is a divalent radical having the meanings $Y^2$ to $Y^4$ below:
$Y^2$: a group of formula:

wherein the symbol $Ar^2$ has the meanings given above,
$Y^3$: a single valency bond, or
$Y^4$: a divalent residue chosen from:

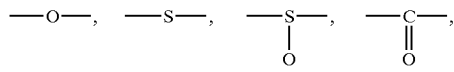

a linear or branched $C_1$–$C_{12}$, alkylene residue and a residue of formula —Si(CH$_3$)$_2$O—; or at least one monosulphonium species having a single cationic centre $S^+$ per mole of cation and consisting, of species of formula:

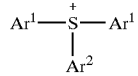

(III.2)

in which $Ar^1$ and $Ar^2$ have the meanings given above with respect to formula (III.1).

3. A composition capable of undergoing cationic polymerisation or radical polymerisation, and crosslinking by irradiation, or by beams of electrons, comprising:

(A) at least one polymerisable organic matrix or at least one partially polymerised organic matrix, comprising monomers, comonomers, oligomers, cooligomers, polymers, or copolymers having epoxy functions (frA);

(B) at least one silicone diluent with a viscosity ηr at 25° C. of less than or equal to 200 mPa·s, and comprising: at least one unit of formula (I):

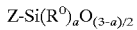

Z-Si(R$^0$)$_a$O$_{(3-a)/2}$ wherein:
a=0, 1 or 2,
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and (C) an effective amount of at least one cationic or radical photoinitiator which is an onium borate of an element from groups 15 to 17 of the Periodic Table or of an organometallic complex of an element from groups 4 to 10 of the Periodic Table, and wherein the onium is an organometallic complex of formula (IV):

$(L^1L^2L^3M)^{+q}$ (IV)

wherein:
M represents a metal from groups 4 to 10 of the Periodic Table,
L1 represents a ligand linked to the metal M via π electrons, this ligand being η3-alkyl, η5-cyclopentadienyl, η7-cycloheptatrienyl ligands, η$^6$-aromatic compounds,
η$^6$-benzene ligands or compounds containing from 2 to 4 fused rings, each ring contributing 3 to 8 π electrons to the valency of the metal M;
$L^2$ represents a ligand linked to the metal M via π electrons, this ligand being η$^7$-cycloheptatrienyl, η$^6$-aromatic compounds η$^6$-benzene or compounds containing from 2 to 4 fused rings, each ring contributing 6 or 7 π electrons to the valency of the metal M;
$L^3$ represents from 0 to 3 identical or different ligands linked to the metal M via σ electrons, this (these) ligand(s) being CO or NO$_2{}^+$;
the total electronic charge q of the complex to which $L^1$, $L^2$ and $L^3$ contribute and the ionic charge of the metal M is positive and equal to 1 or 2.

4. A composition capable of undergoing cationic polymerisation or radical polymerisation, and crosslinking by irradiation, or by beams of electrons, comprising:

(A) at least one polymerisable organic matrix or at least one partially polymerised organic matrix, comprising monomers, comonomers, oligomers, cooligomers, polymers, or copolymers having epoxy functions (frA);

(B) at least one silicone diluent with a viscosity ηr at 25° C. of less than or equal to 200 mPa·s, and comprising:
at least one unit of formula (I):

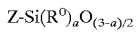

Z-Si(R$^0$)$_a$O$_{(3-a)/2}$ wherein:
a =0, 1 or 2.
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and (C) an effective amount of at least one cationic or radical photoinitiator which is an onium borate of an element from groups 15 to 17 of the Periodic Table or of an organometallic complex of an element from groups 4 to 10 of the Periodic Table, and wherein the borate has the formula:

$[BX_aR_b]^-$ wherein:
a and b are integers ranging, for a, from 0 to 3, and, for b, from 1 to 4, with a+b=4,
the symbols X represent: a halogen atom with a=0 to 3, or an OH function with a=0 to 2,
the symbols R are identical or different and represent:
a phenyl radical substituted with an electron-withdrawing group when the cationic part is an onium of an element from groups 15 to 17,
a phenyl radical substituted with at least one element or an electron-withdrawing group, when the cationic part is an organometallic complex of an element from groups 4 to 10
an aryl radical containing at least two aromatic nuclei irrespective of the cationic species.

5. A composition capable of undergoing cationic polymerisation or radical polymerisation, and crosslinking by irradiation, or by beams of electrons, comprising:
(A) at least one polymerisable organic matrix or at least one partially polymerised organic matrix, comprising monomers, comonomers, oligomers, cooligomers, polymers, or copolymers having epoxy functions (frA);
(B) at least one silicone diluent with a viscosity ηr at 25° C. of less than or equal to 200 mPa·s, and comprising:
at least one unit of formula (I):

$Z-Si(R^0)_aO_{(3-a)/2}$ wherein:
a=0, 1 or 2,
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and
(C) an effective amount of at least one cationic or radical photoinitiator which is an onium borate of an element from groups 15 to 17 of the Periodic Table or of an organometallic complex of an element from groups 4 to 10 of the Periodic Table, and further comprising:
(D) at least one photosensitizer.

6. A composition capable of undergoing cationic polymerisation or radical polymerisation, and crosslinking by irradiation, or by beams of electrons, comprising:
(A) at least one polymerisable organic matrix or at least one partially polymerised organic matrix, comprising monomers, comonomers, oligomers, cooligomers, polymers, or copolymers having epoxy functions (frA);
(B) at least one silicone diluent with a viscosity ηr at 25° C. of less than or equal to 200 mPa·s, and comprising:
at least one unit of formula (I):

$Z-Si(R^0)_aO_{(3-a)/2}$ wherein:
a=0, 1 or 2,
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and
(C) an effective amount of at least one cationic or radical photoinitiator which is an onium borate of an element from groups 15 to 17 of the Periodic Table or of an organometallic complex of an element from groups 4 to 10 of the Periodic Table, and further comprising:
(D) at least one photosensitizer, and
(E) at least one pigment.

7. A composition capable of undergoing cationic polymerisation or radical polymerisation, and crosslinking by irradiation, or by beams of electrons, comprising:
(A) at least one polymerisable organic matrix or at least one partially polymerised organic matrix, comprising monomers, comonomers, oligomers, cooligomers, polymers, or copolymers having epoxy functions (frA);
(B) at least one silicone diluent with a viscosity ηr at 25° C. of less than or equal to 200 mPa·s, and comprising:
at least one unit of formula (I):

$Z-Si(R^0)_aO_{(3-a)/2}$ wherein:
a=0, 1 or 2,
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and
(C) an effective amount of at least one cationic or radical photoinitiator which is an onium borate of an element from groups 15 to 17 of the Periodic Table or of an organometallic complex of an element from groups 4 to 10 of the Periodic Table, and wherein the diluent (B) has a coloration of less than or equal to 200 Hazen, this diluent B being soluble to a proportion of at least 5% by weight in the matrix A.

8. The composition according to claim 7, wherein the diluent (B) has a coloration of less than or equal to 100 Hazen, this diluent B being, soluble to a proportion of at least 20% by weight in the matrix A.

9. A composition capable of undergoing cationic polymerisation or radical polymerisation, and crosslinking by irradiation, or by beams of electrons, comprising:
(A) at least one polymerisable organic matrix or at least one partially polymerised organic matrix, comprising monomers, comonomers, oligomers, cooligomers, polymers, or copolymers having epoxy functions (frA);
(B) at least one silicone diluent with a viscosity ηr at 25° C. of less than or equal to 200 mPa·s, and comprising:
at least one unit of formula (I):

$Z-Si(R^0)_aO_{(3-a)/2}$ wherein:
a=0, 1 or 2,
$R^0$ is independently an alkyl, cycloalkyl, aryl, vinyl, hydrogeno or alkoxy radical, Z is an organic substituent comprising at least one acrylate or alkenyl ether (frB); and
at least two silicon atoms; and
(C) an effective amount of at least one cationic or radical photoinitiator which is an onium borate of an element from groups 15 to 17 of the Periodic Table or of an organometallic complex of an element from groups 4 to 10 of the Periodic Table, and wherein the photoinitiator is

[(Φ)₂I]⁺, [B(C₆F₅)₄]⁻ [(C₈H₁₇)—O—Φ—I—Φ)]⁺, [B(C₆F₅)₄]⁻ [C₁₂H₂₅—Φ—I—Φ]⁺, [B(C₆F₅)₄]⁻ [(C₈H₁₇—O—Φ)₂I]⁺, [B(C₆F₅)₄]⁻ [(C₈H₁₇)—O—Φ—I—Φ)]⁺, [B(C₆F₅)₄]⁻ [(Φ)₃S]⁺, [B(C₆F₅)₄]⁻ [(Φ)₂S—Φ—O—C₈H₁₇]⁺, [B(C₆H₄CF₃)₄]⁻ [C₁₂H₂₅—Φ)₂I]⁺, [B(C₆F₅)₄]⁻ [(Φ)₃ S]⁺, [B(C₆F₄OCF₃)₄]⁻ [(Φ—CH₃)₂I]⁺, [B(C₆F₅)₄]⁻ [(Φ—CH₃)₂I]⁺, [B(C₆F₄OCF₃)₄]⁻ [CH₃—Φ—I—Φ—CH(CH₃)₂]⁺, [B(C₆F₅)₄]⁻ (η⁵-cyclopentadienyl) (η⁶-toluene) Fe⁺, [B(C₆F₅)₄]⁻ (η⁵-cyclopentadienyl) (η⁶-methyl-1-naphthalene) Fee, [B(C₆F₅)₄]⁻, or (η⁵-cyclopentadienyl) (η⁶-cumene) Fe⁺, [B(C₆F₅)₄]⁻.

10. A varnish or ink comprising a composition capable of undergoing cationic polymerisation or radical polymerisation, and crosslinking by irradiation, or by beams of electrons, comprising:

(A) at least one polymerisable organic matrix or at least one partially polymerised organic matrix, comprising monomers, comonomers, oligomers, cooligomers, polymers, or copolymers having epoxy functions (frA);

(B) at least one silicone diluent with a viscosity ηr at 25° C. of less than or equal to 200 mPa·s, and comprising:

at least one unit of formula (I):

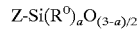

$$Z\text{-}Si(R^0)_a O_{(3-a)/2}$$

wherein:

a=0, 1 or 2,

R⁰ is independently an alkyl, cycloalkyl, aryl, vinyl, hydrogeno or alkoxy radical, Z is an organic substituent comprising at least one acrylate or alkenyl ether (frB); and at least two silicon atoms; and (C) an effective amount of at least one cationic or radical photoinitiator which is an onium borate of an element from groups 15 to 17 of the Periodic Table or of an organometallic complex of an element from groups 4 to 10 of the Periodic Table.

* * * * *